United States Patent
Matsubara et al.

(10) Patent No.: US 6,545,121 B1
(45) Date of Patent: Apr. 8, 2003

(54) POLYIMIDE FILM HAVING DENATURED SURFACE

(75) Inventors: Kenji Matsubara, Ube (JP); Hiroshi Uchiyama, Hirakata (JP)

(73) Assignees: Ube Industries, Ltd., Yamaguchi (JP); E.C. Chemical Co., Ltd., Osaka (JP)

( * ) Notice: Subject to any disclaimer, the term of this patent is extended or adjusted under 35 U.S.C. 154(b) by 84 days.

(21) Appl. No.: 09/630,515

(22) Filed: Aug. 2, 2000

Related U.S. Application Data

(63) Continuation-in-part of application No. 09/238,223, filed on Jan. 27, 1999, now abandoned.

(30) Foreign Application Priority Data

Jan. 28, 1998 (JP) .............................................. 10-32088

(51) Int. Cl.$^7$ .............................. C08J 3/28; C08K 3/22; C08K 3/34; C08K 3/26; C08L 79/08
(52) U.S. Cl. ...................... 528/483; 524/425; 524/431; 524/451; 524/493; 524/497; 524/606; 428/323
(58) Field of Search ................................. 524/425, 431, 524/451, 493, 497, 606; 428/409, 323, 324, 331; 528/483

(56) References Cited

U.S. PATENT DOCUMENTS

| | | | | |
|---|---|---|---|---|
| 4,755,424 A | * | 7/1988 | Takeoka et al. |
| 5,006,411 A | * | 4/1991 | Motonari et al. |
| 5,543,017 A | * | 8/1996 | Uchiyama et al. |
| 5,714,275 A | * | 2/1998 | Yamazaki et al. |

* cited by examiner

Primary Examiner—Tae H. Yoon
(74) Attorney, Agent, or Firm—Reed Smith LLP

(57) ABSTRACT

A polyimide film of 20 to 125 μm thick composed of aromatic polyimide prepared from an aromatic tetracarboxylic acid component (composed mainly of 3,4,3',4'-biphenyltetracarboxylic acid or its derivative) and an aromatic diamine component (composed mainly of p-phenylenediamine) and containing a micro-granular filler of metal atom-containing inorganic material, can be so denatured on its surfaces that an amount of the metal atom and a ratio of oxygen/carbon would increase by 0.03 to 1.0 atomic % and 0.01 to 0.20, respectively, on the processed surfaces, upon running in a gaseous mixture of argon and hydrogen between a plurality of activated plasma discharge electrodes arranged in a double line under such condition that the running polyimide film is free from contact with the electrodes.

3 Claims, 1 Drawing Sheet

FIGURE
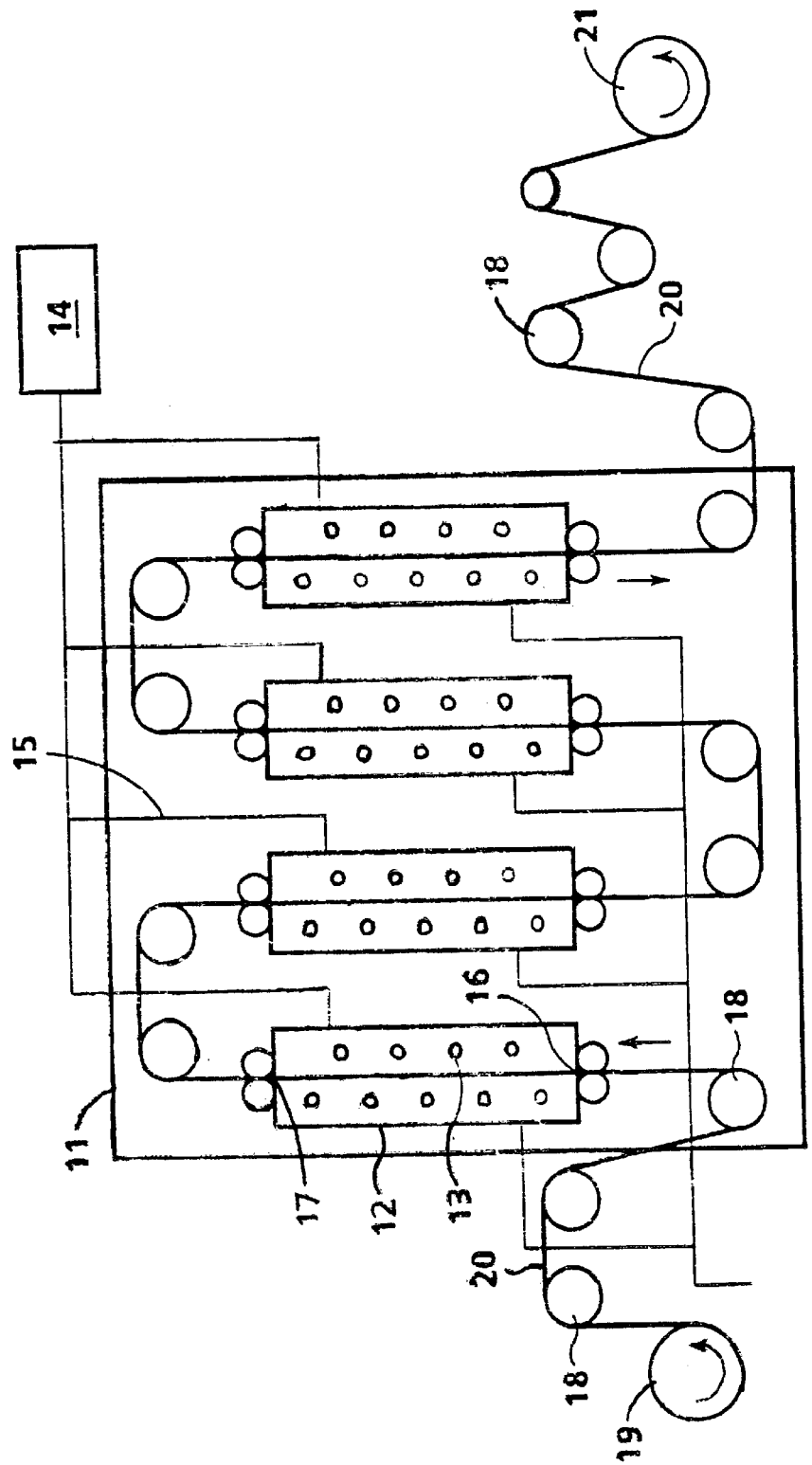

POLYIMIDE FILM HAVING DENATURED SURFACE

RELATED APPLICATION

This application is a continuation-in-part of Ser. No. 09/238,223 filed Jan. 27, 1999, which is abandoned.

FIELD OF THE INVENTION

The present invention relates to a polyimide film having a denatured surface and a process for denaturing the polyimide film. Particularly, the invention relates to a polyimide film comprising aromatic polyimide prepared from an aromatic tetracarboxylic acid component which comprises 3,4, 3',4'-biphenyltetracarboxylic acid, its anhydride or its ester and an aromatic diamine component which comprises p-phenylenediamine, containing a micro-granular filler of metal atom-containing inorganic material, and having a surface so denatured that the denatured surface has increased adhesiveness.

BACKGROUND OF THE INVENTION

Aromatic polyimide having been prepared from an aromatic tetracarboxylic acid component and an aromatic diamine component by polymerization and dehydration shows a high heat resistance as well as a high mechanical strength and a high chemical stability. Therefore, the aromatic polyimide is widely employed in various industrial field, such as fields of art for preparing devices utilizable in electronics and outer space.

The aromatic polyimide has excellent characteristics in various properties, but disadvantageously shows poor adhesiveness when it is prepared in the form of a film. An aromatic polyimide film having poor adhesiveness is not easily bonded to other films such as an aromatic polyimide film or a metal film such as a copper foil with a conventional adhesive. Heretofore, various studies have been made for providing adhesives for firmly bonding an aromatic polyimide film to a-metal foil. Most of the known adhesives are still unsatisfactory for firmly bonding an aromatic polyimide film to a metal foil.

In order to bond firmly an aromatic polyimide film to a metal foil, treatment of a surface of an aromatic polyimide film with corona discharge or plasma discharge processing has been also studied to increase the adhesiveness of a surface of an aromatic polyimide film.

Japanese Patent Provisional Publication No. 63-61030 describes a polyimide film in which an oxygen/carbon ratio on its surface is increased by 0.01 to 0.1, and an amount of volatile material in the film is made to 0.45 wt. % or less, by corona discharge processing.

Japanese Patent Provisional Publication No. H1-138242 describes that an aromatic polyimide film is denatured in its surface by discharge processing such as corona discharge processing under the condition that the aromatic polyimide film is kept on a discharge electrode.

Japanese Patent Provisional Publication No. H3-56541 describes a process for denaturing an aromatic polyimide film by treating the film with an organic solvent and then processing the film by plasma discharge.

Japanese Patent Provisional Publication No. H5-1160 describes a process for denaturing an aromatic polyimide film by discharge processing such as plasma discharge processing using a specifically designed electrode at an atmospheric pressure under the condition that the aromatic polyimide film is kept on a drum electrode.

In the above-mentioned publications, it is stated that the described denaturing process is favorably applied to various heat-resistant resin films such as aromatic polyimide films. In the working examples of the publications, however, the corona discharge processing or plasma discharge processing is applied only to a film of aromatic:polyimide which is prepared from pyromellitic dianhydride and 4,4-diaminodiphenyl ether (commercially available in the name of "Kapton"), for increasing adhesiveness of the polyimide film.

According to the studies by the present inventors, however, it cannot be said that all aromatic polyimide films can be increased in the adhesiveness on their surfaces by the known corona discharge processing or plasma discharge processing. For instance, there is known a film of aromatic polyimide which is prepared from an aromatic tetracarboxylic acid component comprising 3,4,3',4'-biphenyltetracarboxylic acid, its anhydride or its ester and an aromatic diamine component comprising p-phenylenediamine. An aromatic polyimide film of this type has a higher heat-resistance, a higher mechanical strength and/or better chemical stability, as compared with the above-mentioned film of aromatic polyimide prepared from pyromellitic dianhydride and 4,4-diaminodiphenyl ether, but has a disadvantageous feature in that the film is hardly increased in its surface adhesiveness, due to, possibly, its high chemical stability. According to the studies by the present inventors, the film of aromatic polyimide prepared from an aromatic tetracarboxylic acid component comprising 3,4,3'4'-biphenyltetracarboxylic acid, its anhydride or its ester and an aromatic diamine component comprising p-phenylenediamine cannot be denatured to give a satisfactory adhesiveness by the conventional discharge processing (particularly, plasma discharge processing at an atmospheric condition).

SUMMARY OF THE INVENTION

Accordingly, it is an object of the present invention to provide a film of aromatic polyimide prepared from an aromatic tetracarboxylic acid component comprising 3,4,3', 4'-biphenyltetracarboxylic acid, its anhydride or its ester and an aromatic diamine component comprising p-phenylenediamine whose surface has good surface activity, particularly, increased adhesiveness.

The present invention resides in a polyimide film of 20 to 125 $\mu$m thick which comprises aromatic polyimide prepared from an aromatic tetracarboxylic acid component comprising 3,4,3',4'-biphenyltetracarboxylic acid, its anhydride or its ester and an aromatic diamine component comprising p-phenylenediamine and contains a micro-granular filler of metal atom(e.g., Si, Ca, Mg)-containing inorganic material, in which at least one surface of the polyimide film has been so processed by plasma discharge that an amount of the metal atom and a ratio of oxygen/carbon increase by 0.03 to 1.0 atomic % and 0.01 to 0.20, respectively, on the processed surface. The increases of the metal atom amount and the oxygen/carbon ratio are calculated based on the metal atom amount and the oxygen/carbon ratio on the untreated polyimide film.

The above-mentioned polyimide film of the invention can be easily prepared by a process for denaturing a polyimide film of 20 to 125 gm thick on its surfaces, the polyimide film comprising aromatic polyimide prepared from an aromatic tetracarboxylic acid component which comprises 3,4,3',4'-biphenyltetracarboxylic acid, its anhydride or its ester and an aromatic diamine component which comprises p-phenylenediamine and containing a micro-granular filler of metal atom-containing inorganic material, which comprises processing the polyimide film on its surfaces by plasma discharge, by running the polyimide film in a gaseous mixture of argon and hydrogen between a plurality of activated plasma discharge electrodes arranged in a double line under such condition that the running polyimide film is free from contact with the electrodes.

Preferably, the surface of the polyimide film of the invention has been so processed by plasma discharge that the amount of the metal atom and the ratio of oxygen/carbon increase by 0.03 to 0.92 atomic 6 (more preferably 0.03 to .0.8 atomic %, most preferably 0.03 to 0.5 atomic %, specifically preferably 0.05 to 0.5 atomic %) and 0.01 to 0.20, respectively, on the processed surface. Preferably, the surface of the polyimide film of the invention has been so processed by plasma discharge that the amount of the metal atom is in the range of 0.5 to 1.5 atomic %, and the ratio of oxygen/carbon increases by 0.11 to 0.15, on the processed surface.

The micro-granular filler of metal atom-containing inorganic material is preferably selected from the group consisting of particles of silicon dioxide, titanium dioxide, magnesium oxide, calcium carbonate, and talc having a mean particle size in the range of 0.01 to 5.0 $\mu$m. The micro-granular filler is preferably contained in the polyimide film in an amount of 0.02 to 5.0 weight %, based on the amount of the polyimide film.

BRIEF DESCRIPTION OF THE DRAWING

FIGURE illustrates a device for plasma discharge processing which is favorably employable in the denaturation of the aromatic polyimide film of the invention.

DETAILED DESCRIPTION OF THE INVENTION

The aromatic polyimide film of the invention which has a surface denatured to show increased adhesiveness.

The material of the polyimide film of the invention is described in many publications and is already known.

The aromatic tetracarboxylic acid component employed in the invention comprises a 3,4,3',4'-biphenyltetracarboxylic acid component (namely, 3,4,3',4'-biphenyltetracarboxylic acid, its anhydride such as its dianhydride, or its ester) and, if desired, can further comprise one or more of other aromatic tetracarboxylic acid components such as a 2,3,3'4'-biphenyltetracarboxylic acid component (e.g., its dianhydride) and a pyromellitic acid component (e.g., its dianhydride) under the condition that the amount of other aromatic tetracarboxylic acid components does not exceed 90 molar % of whole aromatic tetracarboxylic acid components. In other words, the 3,3',4,4'-biphenyltetracarboxylic acid component can be utilized in a molar amount of 10 to 100 molar %.

The aromatic diamine component employed in the invention comprises p-phenylenediamine and, if desired, can further comprise one or more of diphenyl ether-type diamines such as 4,4'-diaminodiphenyl ether, 3,3'-diaminodiphenyl ether, 3,3'-dimethyl-4,4'-diaminodiphenyl ether, and 3,3'-dimethoxy-4,4'-diaminodiphenyl ether and/or other aromatic diamines under the condition that the amount of other aromatic diamines does not exceed 90 molar % of whole aromatic diamine components. In other words, the p-phenylenediamine can be utilized in a molar amount of 10 to 100 molar %.

The aromatic polyimide film of the invention has a thickness in the range of 20 to 125 $\mu$m, preferably 50 to 125 $\mu$m, and contains a micro-granular metal-containing inorganic filler. Examples of the micro-granular metal-containing inorganic fillers include particles of silicon dioxide, titanium dioxide, magnesium oxide, calcium carbonate, and talc, which preferably has a mean particle size in the range of 0.01 to 5.0 $\mu$m. Preferably, the micro-granular filler is contained in the polyimide film in an amount of 0.02 to 5.0 weight %, based on the amount of the polyimide film.

The aromatic polyimide film which is subjected to plasma discharge processing can be prepared by the following preparing process: a dope solution (i.e., a solution of a polyamide acid which is prepared from an aromatic carboxylic acid component and an aromatic diamine component) is casted on a continuous support web, and heated to give a dry film which is then separated from the support web and further heated to an elevated temperature for performing dehydration-imidation reaction.

The inorganic filler can be incorporated into a polyamide acid dope solution in any time such as before its preparation, during its preparation, or after its preparation. The inorganic filler is well dispersed in the dope solution.

According to the invention, the aromatic polyimide film which is prepared from an aromatic tetracarboxylic acid component comprising 3,4,3',4'-biphenyltetracarboxylic acid, its anhydride or its ester and an aromatic diamine component comprising p-phenylenediamine, which is resistant to surface denaturation, is first denatured by incorporating a micro-granular filler of inorganic material into the polyimide film so that the film surface can become to have a great number of protrusions on the surface. The so denatured aromatic polyimide film is improved in its adhesiveness on the surface which was in contact with the support web in its preparation but is still poor in its adhesiveness on the opposite surface. The former surface is generally called "B plane", while the latter surface is generally called "A plane".

Accordingly, the plasma discharge processing of the invention is most advantageously applied to the A plane of the aromatic polyimide film containing an inorganic filler. When the inorganic filler-containing aromatic polyimide film is subjected to the plasma discharge processing, the polyimide surface layer covering the incorporated filler particles is oxidized, broken or removed to exposed the filler particles on the film surface, whereby the adhesiveness is greatly increased.

Therefore, the plasma discharge processing is advantageously applied to the A plane which was free from the contact with the support web in its preparation. It is most advantageous that the plasma discharge processing is applied to both surfaces of the aromatic polyimide film.

The plasma discharge processing applied to the inorganic filler-containing aromatic polyimide film is described in more detail with reference to the plasma discharge device illustrated in the attached FIGURE.

In FIGURE, a housing for plasma discharge processing is denoted by the numeral of 11. In the housing 11, a number of plasma discharging chambers 12 are provided. In each plasma discharging chamber 12, a plurality of plasma discharging electrodes 13 are arranged in two lines. The plasma discharging chamber 12 is equipped with a gaseous mixture inlet pipe 15 for supplying a gaseous mixture of argon and hydrogen into the chamber 12 from a gaseous mixture supplying device 14, and is provided with an inlet 16 and an outlet 17 for running an aromatic polyimide film to be processed by the plasma discharge.

The plasma discharge processing is preferably performed in a gaseous atmosphere comprising an argon gas, a nitrogen gas in an amount of 1 to 50 moles based on 100 moles of argon gas and a hydrogen gas in an amount of 1 to 50 moles based on 100 moles of argon gas. If desired, other inert gas such as helium is added in an amount of 1 to 50 moles based on 100 moles of argon gas.

Inside and outside of the housing 11 for plasma discharge processing are placed a number of rollers 18 for transferring an continuous aromatic polyimide film 20. The continuous aromatic polyimide film 20 is drawn from a roller 19 and then smoothly transferred by the rollers 18 into the housing 11 for plasma discharge. The processed aromatic polyimide film is drawn from the housing 11 and wound up around a roller 21.

The plasma discharge device illustrated in FIGURE can be modified in various points such as number of the discharging chambers, their configuration, number of the plasma discharging electrodes, and their configurations.

In the plasma discharge chamber, the continuous aromatic polyimide film is preferably run not in contact with any of the plasma discharging electrodes, so that both surfaces of the polyimide film can be subjected to the plasma discharge processing.

If desired, the aromatic polyimide film can be treated with an organic solvent in advance of being subjected to the plasma discharge processing, in the same manner as that described in Japanese Patent Provisional Publication No. H3-56541.

The present invention is further described by the following examples.

EXAMPLES 1 TO 8

(1) Aromatic Polyimide Film 3,4,3',4'-biphenyltetracarboxylic dianhydride and p-phenylene diamine in equimolar amounts are reacted in the known manner to give a continuous aromatic polyimide film containing 0.2 wt. % of $SiO_2$.

(2) Plasma Discharge Processing

The aromatic polyimide film was subjected to plasma discharge processing (at an atmospheric pressure) in a plasma discharge processing device illustrated in FIGURE under the conditions set forth in Table 1.

TABLE 1

|  | Gaseous mixture for plasma discharge (molar ratio) | Rate of film running (m/min.) |
|---|---|---|
| Comparison | Ar | 0.5 |
| Example 1 | $Ar/N_2/H_2$ (90/2/3) | 1.0 |
| Example 2 | $Ar/N_2/H_2$ (90/2/3) | 0.5 |
| Example 3 | $Ar/N_2/H_2$ (90/2.5/3) | 0.5 |
| Example 4 | $Ar/N_2/H_2$ (90/4/3) | 1.0 |
| Example 5 | $Ar/N_2/H_2$ (90/2/3) | 1.5 |
| Example 6 | $Ar/N_2/H_2$ (90/2/2) | 0.5 |
| Example 7 | $Ar/N_2/H_2/He$ (90/2/3/10) | 0.5 |
| Example 8 | $Ar/N_2/H_2$ (90/2/5) | 0.5 |

(3) Analysis of Surface Composition of Processed Film

1) Silicon (Si) Atomic Concentration (Atomic %)

The silicon atomic concentration of the aromatic polyimide film having been subjected to plasma discharge processing is measured by the known ESCA method. The Si atomic % is set forth in Table 2.

2) Increase of Oxygen/Carbon Ratio

The aromatic polyimide film is subjected to the ESCA measurement before and after the plasma discharge processing for determining the oxygen/carbon ratios on the surface. The increase of its ratio by the plasma discharge processing is set forth in Table 2.

3) Evaluation of Adhesiveness of the Polyimide Film

The aromatic polyimide films (before the plasma discharge processing and after the plasma discharge processing) were evaluated in its adhesiveness in both surfaces (A plane corresponding to the surface having been not placed in contact with a support web in the process for preparing the polyimide film, and B plane corresponding to the surface having been placed in contact with a support web in the process for preparing the polyimide film) by the following conditions:

a) Adhesive: acryl resin adhesive (Pyralux available from du Pont (E. I.) de Nemours & Co.)

b) Sheet for adhesion: copper foil(thickness: 30 μm)

c) Bonding procedures: heat press at 180° C., 20 kg/cm² for 40 min.

d) Measurement of adhesion strength: T-peeling, peeling rate: 50 mm/min.

TABLE 2

|  | Increase of oxygen/carbon | Si content (atomic %) | Adhesion strength (kg/cm) | |
|---|---|---|---|---|
|  |  |  | A plane | B plane |
| Unprocessed | — | 0.16 | 0.4 | 1.2 |
| Comparison | — | 0.18 | 0.5 | 1.3 |
| Example 1 | 0.186 | 0.23 | 1.2 | 1.2 |
| Example 2 | 0.137 | 1.08 | 1.3 | 1.3 |
| Example 3 | 0.144 | 0.96 | 1.2 | 1.3 |
| Example 4 | 0.127 | 0.51 | 1.3 | 1.4 |
| Example 5 | 0.115 | 0.54 | 1.4 | 1.4 |
| Example 6 | 0.120 | 0.80 | 1.4 | 1.4 |
| Example 7 | 0.119 | 0.76 | 1.4 | 1.4 |
| Example 8 | 0.030 | 0.25 | 1.2 | 1.2 |

Remark:
The values of increase of oxygen/carbon and Si atomic content were measured on the A plane, but these values on the B plane are almost the same as those on the A-plane.

As is apparent from the results seen in Table 2, the film of aromatic polyimide having been prepared from 3,4,3',4'-biphenyltetracarboxylic dianhydride and p-phenylenediamine which is increased in the oxygen/carbon ratio and Si atomic % on its surface by the plasma discharge processing shows increased surface adhesiveness. The increase of surface adhesiveness is particularly prominent on the A plane which was placed in no contact with a support web in the process for preparing the polyimide film.

What is claimed is:

1. A polyimide film of 20 to 125 μm thick which comprises aromatic polyimide prepared from an aromatic tetracarboxylic acid component comprising $3,4,3^1,4^1$-biphenyltetracarboxylic acid, its anhydride or its ester and an aromatic diamine component comprising p-phenylenediamine and contains a micro-granular filler of metal atom-containing inorganic material, in which both surfaces of the polyimide film have been so processed by plasma discharge that the amount of the metal atom and the ratio of oxygen/carbon increase by 0.03 to 1.0 atomic % and 0.11 to 0.15, respectively, on the processed surfaces.

2. The polyimide film of claim 1, wherein the micro-granular filler of metal atom-containing inorganic material is selected from the group consisting of particles of silicon dioxide, titanium dioxide, magnesium oxide, calcium carbonate, and talc having a mean particle size in the range of 0.01 to 5.0 μm.

3. The polyimide film of claim 1, wherein the micro-granular filler of metal atom-containing inorganic material is contained in the polyimide film in an amount of 0.02 to 5.0 weight %, based on the amount of the polyimide film.

* * * * *